(12) United States Patent
Song et al.

(10) Patent No.: US 7,567,452 B2
(45) Date of Patent: Jul. 28, 2009

(54) MULTI-LEVEL DYNAMIC MEMORY DEVICE HAVING OPEN BIT LINE STRUCTURE AND METHOD OF DRIVING THE SAME

(75) Inventors: Ki-whan Song, Seoul (KR); Yeong-taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 203 days.

(21) Appl. No.: 11/637,519

(22) Filed: Dec. 12, 2006

(65) Prior Publication Data
US 2007/0139994 A1 Jun. 21, 2007

(30) Foreign Application Priority Data
Dec. 15, 2005 (KR) ..................... 10-2005-0124010

(51) Int. Cl.
*G11C 11/02* (2006.01)
(52) U.S. Cl. .................. 365/149; 365/185.21; 365/190; 365/205
(58) Field of Classification Search ................. 365/149, 365/190, 185.21, 205
See application file for complete search history.

(56) References Cited

U.S. PATENT DOCUMENTS

| | | | | |
|---|---|---|---|---|
| 4,918,663 A | * | 4/1990 | Remington et al. | ......... 365/226 |
| 4,951,256 A | * | 8/1990 | Tobita | ......... 365/208 |
| 5,227,697 A | * | 7/1993 | Sakagami | ......... 365/203 |
| 5,608,668 A | | 3/1997 | Zagar et al. | |
| 5,953,275 A | * | 9/1999 | Sugibayashi et al. | ........ 365/207 |
| 6,130,476 A | | 10/2000 | LaFontaine, Jr. et al. | |
| 6,549,476 B2 | | 4/2003 | Pinney | |
| 7,106,626 B2 | | 9/2006 | Goldman et al. | |
| 2003/0214867 A1 | | 11/2003 | Goldman et al. | |
| 2005/0265098 A1 | | 12/2005 | Goldman et al. | |

FOREIGN PATENT DOCUMENTS

| | | |
|---|---|---|
| KR | 2000-0004509 | 1/2000 |
| KR | 2005-0007546 | 1/2005 |
| WO | 03/100786 A2 | 12/2003 |
| WO | 03/100786 A3 | 12/2003 |

\* cited by examiner

*Primary Examiner*—Pho M. Luu
(74) *Attorney, Agent, or Firm*—Mills & Onello, LLP

(57) ABSTRACT

A multi-level dynamic memory device having an open bit line structure is disclosed. The multi-level dynamic memory device includes a plurality of word lines; a plurality of bit lines provided in an open bit line structure; a plurality of memory cells each of which is connected to each of the word lines and each of the bit lines and stores at least two bits of data; and a plurality of sense amplifiers, each of which amplifies a voltage difference between the bit lines, the bit lines being located at opposite sides of each of the plurality of sense amplifiers.

17 Claims, 4 Drawing Sheets

MULTI-LEVEL DYNAMIC MEMORY DEVICE HAVING OPEN BIT LINE STRUCTURE AND METHOD OF DRIVING THE SAME

CROSS-REFERENCE TO RELATED APPLICATION

This application claims priority under 35 U.S.C. § 119 to Korean Patent Application No. 10-2005-0124010 filed on Dec. 15, 2005, in the Korean Intellectual Property Office, the disclosure of which is incorporated herein by reference in its entirety.

BACKGROUND OF THE INVENTION

1. Technical Field

The present invention relates to a multi-level dynamic memory device having an open bit line structure and a method of driving the same, and more particularly, to a multi-level dynamic memory device that is highly integrated and a method of driving the same.

2. Description of the Related Art

In recent years, various methods of storing a large amount of data in a limited wafer have been developed. Due to sophisticated lithographic methods and apparatuses, a large number of memory cells can be fabricated within a small wafer. Another method stores one or more bits in one memory cell, thereby realizing an increase in the integration level of a dynamic memory device per unit area. This is generally known as a "multi-level dynamic memory device."

A conventional multi-level dynamic memory device has been developed on the basis of a folded bit line structure. In the folded bit line structure, since both a bit line and a complementary bit line are located in the same memory cell block, the amount of coupling noise generated between the bit line and a word line is equal to the amount of coupling noise generated between the complementary bit line and the word line. This common-mode noise can be eliminated by a differential amplification operation of a sense amplifier.

However, in the folded bit line structure, it is difficult to reduce the size of a memory cell to less than 8 $F^2$/bit. Here, "F" denotes the minimum feature size, that is, a minimum design rule in which a patterning process can be performed. For this reason, a new structure capable of improving the integration level of the multi-level dynamic memory device is required.

SUMMARY OF THE INVENTION

In accordance with one aspect of the present invention, a multi-level dynamic memory device includes: a plurality of word lines; a plurality of bit lines provided in an open bit line structure; a plurality of memory cells, wherein each memory cell is connected to one of the word lines and one of the bit lines and configured to store at least two bits of data; and a plurality of sense amplifiers each of which amplifies a voltage difference between the bit lines, the bit lines being located at opposite sides of each of the plurality of sense amplifiers.

In the multi-level dynamic memory device, the size of each of the memory cells can be smaller than 8 $F^2$/bit, where "F" denotes a minimum feature size.

In accordance with an another aspect of the present invention, a multi-level dynamic memory device includes: a plurality of word lines; a first bit line and a second bit line provided in an open bit line structure, the first bit line being divided into a first main bit line and a first sub-bit line and the second bit line being divided into a second main bit line and a second sub-bit line; a plurality of memory cells, wherein each memory cell is connected to one of the word lines and one of the first or second main bit lines; a first sense amplifier connected between the first main bit line and the second sub-bit line and a second sense amplifier connected between the second main bit line and the first sub-bit line; a first coupling capacitor connected between the first main bit line and the first sub-bit line and a second coupling capacitor connected between the second main bit line and the second sub-bit line In the multi-level dynamic memory device, the size of each of the memory cells can be smaller than 8 $F^2$/bit, where "F" denotes a minimum feature size.

The capacitance of a cell capacitor of each of the memory cells can be substantially equal to the capacitance of each of the first and second main bit lines.

The multi-level dynamic memory device can further comprise: a first transfer transistor configured to selectively connect the first and second main bit lines to each other; and a second transfer transistor configured to selectively connect the first and second sub-bit lines to each other.

The multi-level dynamic memory device can further comprise: a first isolation transistor located on the first bit line and configured to selectively isolate memory cells from the plurality of memory cells that are on the first bit line from the first sense amplifier; and a second isolation transistor located on the second bit line and configured to selectively isolate memory cells from the plurality of memory cells that are on the second bit line from the second sense amplifier.

The multi-level dynamic memory device can further comprise: a first correction capacitor connected in parallel to the first coupling capacitor; and a second correction capacitor connected in parallel to the second coupling capacitor, wherein capacitances of the first and second correction capacitors are adjusted by a first control voltage signal.

In the multi-level dynamic memory device, the first correction capacitor can be a MOS capacitor having a gate connected to a node of the first coupling capacitor and having a source and a drain supplied with the first control voltage signal; and the second correction capacitor can be a MOS capacitor having a gate connected to a node of the second coupling capacitor and having a source and a drain supplied with the first control voltage signal.

In the multi-level dynamic memory device, the capacitance of each of the first and second coupling capacitors can be adjusted by a second control voltage signal.

In the multi-level dynamic memory device, each of the first and second coupling capacitors can be a MOS capacitor, and the second control voltage signal can be supplied to a substrate of the MOS capacitor.

In accordance with an another aspect of the present invention, a multi-level dynamic memory device includes: a plurality of word lines; a first bit line and a second bit line provided in an open bit line structure, the first bit line being divided into a first main bit line and a first sub-bit line and the second bit line being divided into a second main bit line and a second sub-bit line; a plurality of memory cells, wherein each memory cell is connected to one of the word lines and one of the first or second main bit lines; a first sense amplifier connected between the first main bit line and the second sub-bit line and a second sense amplifier connected between the second main bit line and the first sub-bit line; a first coupling capacitor connected between the first main bit line and the first sub-bit line and a second coupling capacitor connected between the second main bit line and the second sub-bit line; a first transfer transistor configured to selectively connect the first and second main bit lines to each other and a second transfer transistor configured to selectively connect the first and second sub-bit lines to each other; and a first isolation transistor located on the first bit line and configured to selectively isolate memory cells from the plurality of memory cells that are on the first bit line from the first sense amplifier; and a second isolation transistor located on the second bit line and configured to selectively isolate memory cells from the plurality of memory cells that are on the second bit line from the second sense amplifier.

In accordance with another aspect of the present invention, a method of driving a multi-level dynamic memory device having a plurality of word lines; a first bit line and a second bit line provided in an open bit line structure, the first bit line being divided into a first main bit line and a first sub-bit line and the second bit line being divided into a second main bit line and a second sub-bit line; a plurality of memory cells, wherein each memory cell is connected to one of the word lines and one of the first or second main bit lines; a first sense amplifier connected between the first main bit line and the second sub-bit line and a second sense amplifier connected between the second main bit line and the first sub-bit line; a first coupling capacitor connected between the first main bit line and the first sub-bit line and a second coupling capacitor connected between the second main bit line and the second sub-bit line; a first transfer transistor configured to selectively connect the first and second main bit lines to each other and a second transfer transistor configured to selectively connect the first and second sub-bit lines to each other; and a first isolation transistor located on the first bit line and configured to selectively isolate memory cells from the plurality of memory cells that are on the first bit line from the first sense amplifier; and a second isolation transistor located on the second bit line and configured to selectively isolate memory cells from the plurality of memory cells that are on the second bit line from the second sense amplifier, the method including: charge-sharing data of a memory cell, selected from the plurality of memory, cells that is connected to the first bit line, between the first and second main bit lines; amplifying a voltage difference between the first main bit line and the second sub-bit line using the first sense amplifier; amplifying a voltage difference between the second main bit line and the first sub-bit line using the second sense amplifier; and restoring data in the selected memory cell using the first and second main bit lines that are charge-shared.

In the method, in the charge-sharing and the restoring, the first and second transfer gates can be turned on.

In the method, in the amplifying of the voltage difference using the first sense amplifier and in the amplifying of the voltage difference using the second sense amplifier, the first and second isolation transistors can be turned off.

The method can include, before the restoring of the data, turning on the first and second isolation transistors.

In the method, the capacitance of a cell capacitor of each of the memory cells can be substantially equal to the capacitance of each of the first and second main bit lines.

BRIEF DESCRIPTION OF THE DRAWINGS

Various aspects of the invention will become more apparent in view of the attached drawing figures, which are provided by way of example, not by way of limitation, in which.

DETAILED DESCRIPTION OF THE EXEMPLARY EMBODIMENTS

Figure 1:
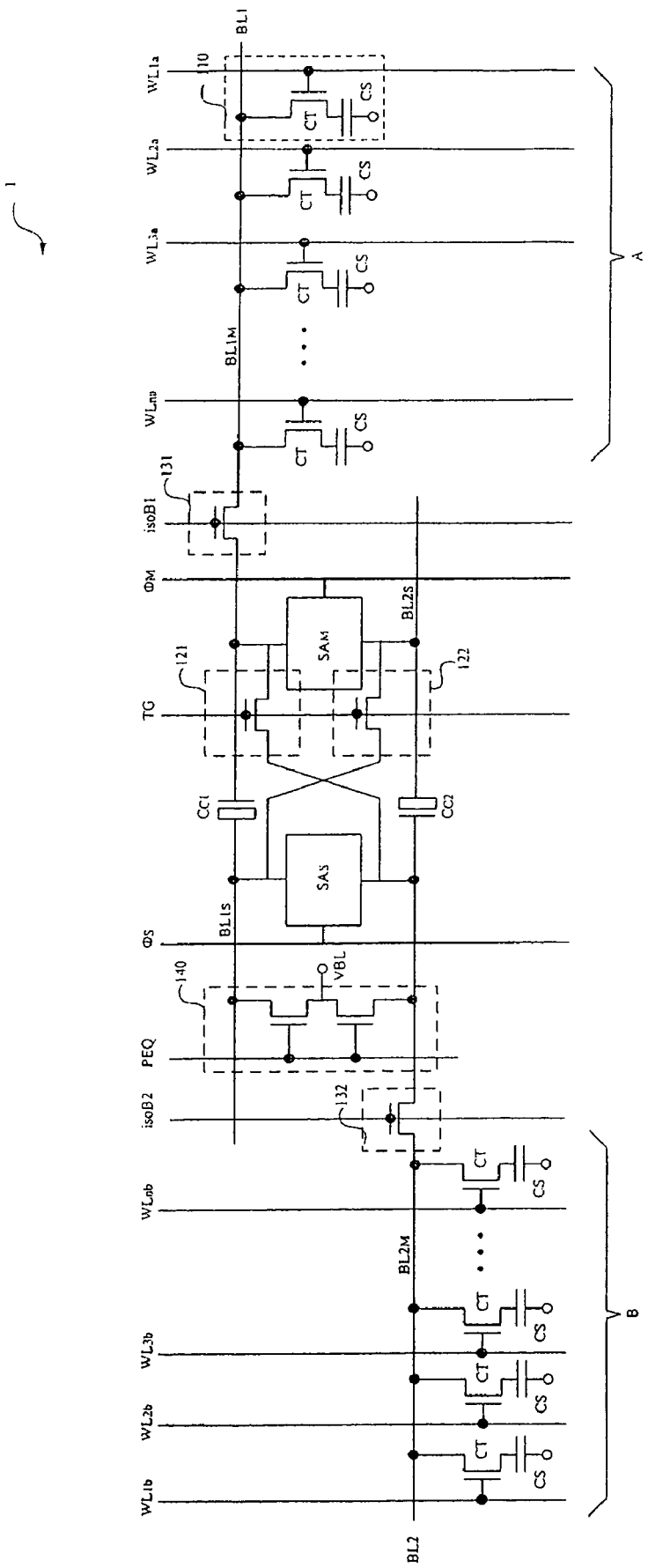
FIG. 1 is a circuit diagram illustrating an embodiment of a multi-level dynamic memory device according to one aspect of the present invention.

Advantages and features of the present invention can be understood more readily by reference to the following detailed description of preferred embodiments and the accompanying drawings. The present invention can, however, be embodied in many different forms and should not be construed as being limited to the embodiments set forth herein.

The present invention will now be described more fully with reference to the accompanying drawings, in which like reference numerals refer to like elements throughout the drawings and specification.

It will be understood that when an element is referred to as being "on," "connected" or "coupled" to another element, it can be directly on, connected or coupled to the other element or intervening elements can be present. In contrast, when an element is referred to as being "directly on," "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a circuit diagram illustrating an embodiment of a multi-level dynamic memory device 1 according to one aspect of the present invention, including a first bit line BL1 and a second bit line BL2. In this embodiment, the multi-level dynamic memory device 1 has an open line bit structure. The device includes a plurality of memory cells, wherein each memory cell takes the form of memory cell 110, in this embodiment. A first group A of the memory cells is connected to BL1 and a second group B of the memory cells is connected to BL2. Here, a case in which selected memory cells in group A are connected to a first bit line BL1 will be mainly described for explanatory convenience. The description would be substantially similar for the memory cells in group B for bit line BL2.

The first bit line BL1 and a second bit line BL2 are each located at different sides of two sense amplifiers $SA_M$ and $SA_S$, respectively. In addition, the first bit line BL1 has a first main bit line $BL1_M$ and a first sub-bit line $BL1_S$, which are located at opposite sides of a first coupling capacitor $C_{C1}$, shown respectively right and left of $C_{C1}$ in FIG. 1. Similarly, the second bit line BL2 has a second main bit line $BL2_M$ and a second sub-bit line $BL2_S$, which are located at opposite sides of a second coupling capacitor $C_{C2}$, shown respectively right and left of $C_{C2}$ in FIG. 1. Here, the capacitance of the first bit line BL1 can be substantially equal to that of the second bit line BL2. Specifically, in this embodiment, the capacitance of the first main bit line $BL1_M$ can be substantially equal to that of the second main bit line $BL2_M$, and the capacitance of the first sub-bit line $BL1_S$ can be substantially equal to that of the second sub-bit line $BL2_S$. This can be accomplished by, for example, making the sizes of the first and second main bit lines $BL1_M$ and $BL2_M$ equal to each other and making the sizes of the first and second sub-bit line $BL1_S$ and $BL2_S$ equal to each other.

In this embodiment, each of the memory cells in group A is connected to one of the word lines WL1a to WLna and BL1 (specifically, main bit line $BL1_M$. And each of the memory cells in group B is connected to one of the word line WL1b to WLnb and the bit line BL2 (specifically, each of the main bit lines $BL1_M$ and $BL2_M$). In addition, since the lengths of the bit lines BL1 and BL2 are substantially equal to each other, the number of memory cells connected to each of the first and second bit lines BL1 and BL2 can be denoted as "n." Each of the memory cells includes a cell capacitor CS and an access transistor CT. Further, the capacitance of the cell capacitor CS can be substantially equal to that of each of the main bit lines $BL1_M$ and $BL2_M$.

The sense amplifiers $SA_M$ and $SA_S$ serve to amplify the voltage difference between the first and second bit lines BL1 and BL2. Specifically, the first sense amplifiers $SA_M$ is connected between the first main bit line $BL1_M$ and the second sub-bit line $BL2_S$ and amplifies the voltage difference between the first main bit line $BL1_M$ and the second sub-bit line $BL2_S$ in response to a first sense amplifier enable signal $\Phi_M$. Further, the second sense amplifiers $SA_S$ is connected between the second main bit line $BL2_M$ and the first sub-bit line $BL1_S$ and amplifies the voltage difference between the second main bit line $BL2_M$ and the first sub-bit line $BL1_S$ in response to a second sense amplifier enable signal $\Phi_S$. Although not shown in the drawing, the first and second sense amplifiers $SA_M$ and $SA_S$ can include a p-type sense amplifier and an n-type sense amplifier.

Further, the first coupling capacitor $C_{C1}$ is connected between the first main bit line $BL1_M$ and the first sub-bit line $BL1_S$, and the second coupling capacitor $C_{C2}$ is connected between the second main bit line $BL2_M$ and the second sub-bit line $BL2_S$. The first and second coupling capacitors $C_{C1}$ and $C_{C2}$ cause the voltage of the second main bit line $BL2_M$ and the voltage of the first sub-bit line $BL1_S$ to vary in the directions opposite to each other when the first sense amplifier $SA_M$ amplifies a voltage between the first main bit line $BL1_M$ and the second sub-bit line $BL2_S$ (refer to 't4' in FIG. 2). The voltage between the second main bit line $BL2_M$ and the first sub-bit line $BL1_S$ that has varied, as described above, serves to cause an offset voltage of the second sense amplifier $SA_S$.

Further, the first transfer transistor 121 selectively connects the first main bit line $BL1_M$ and the second main bit line $BL2_M$ to each other in response to a transfer signal TG. And the second transfer transistor 122 selectively connects the first sub-bit line $BL1_S$ and the second sub-bit line $BL2_S$ to each other in response to the transfer signal TG.

Furthermore, first and second isolation transistors 131 and 132 are located on the first and second bit lines BL1 and BL2, respectively. In addition, the first isolation transistor 131 serves to electrically isolate each of the plurality of memory cells in group A from the first sense amplifier $SA_M$ in response to a first isolation signal isoB1, and the second isolation transistor 132 serves to electrically isolate each of the plurality of memory cells in group B from the second sense amplifier $SA_S$ in response to a second isolation signal isoB2.

An equalizer 140 is connected between the first and second bit lines BL1 and BL2 and precharges each of the first and second bit lines BL1 and BL2 to a precharge voltage VBL having a predetermined voltage level (for example, ½ VDD) in response to an equalizing signal PEQ. In FIG. 1, the equalizer 140 is connected between the second main bit line $BL2_M$ and the first sub-bit line $BL1_S$. However, the present invention is not limited thereto.

In the multi-level dynamic memory device 1 having the open bit line structure, as provided above, it is possible to reduce the size of a memory cell to less than 8 $F^2$/bit, for example, to 6 $F^2$/bit. As a result, the integration level of the multi-level dynamic memory device is increased.

Hereinafter, an operation of the multi-level dynamic memory device according to one aspect of the present invention will be described with reference to FIGS. 1 and 2.

Figure 2:
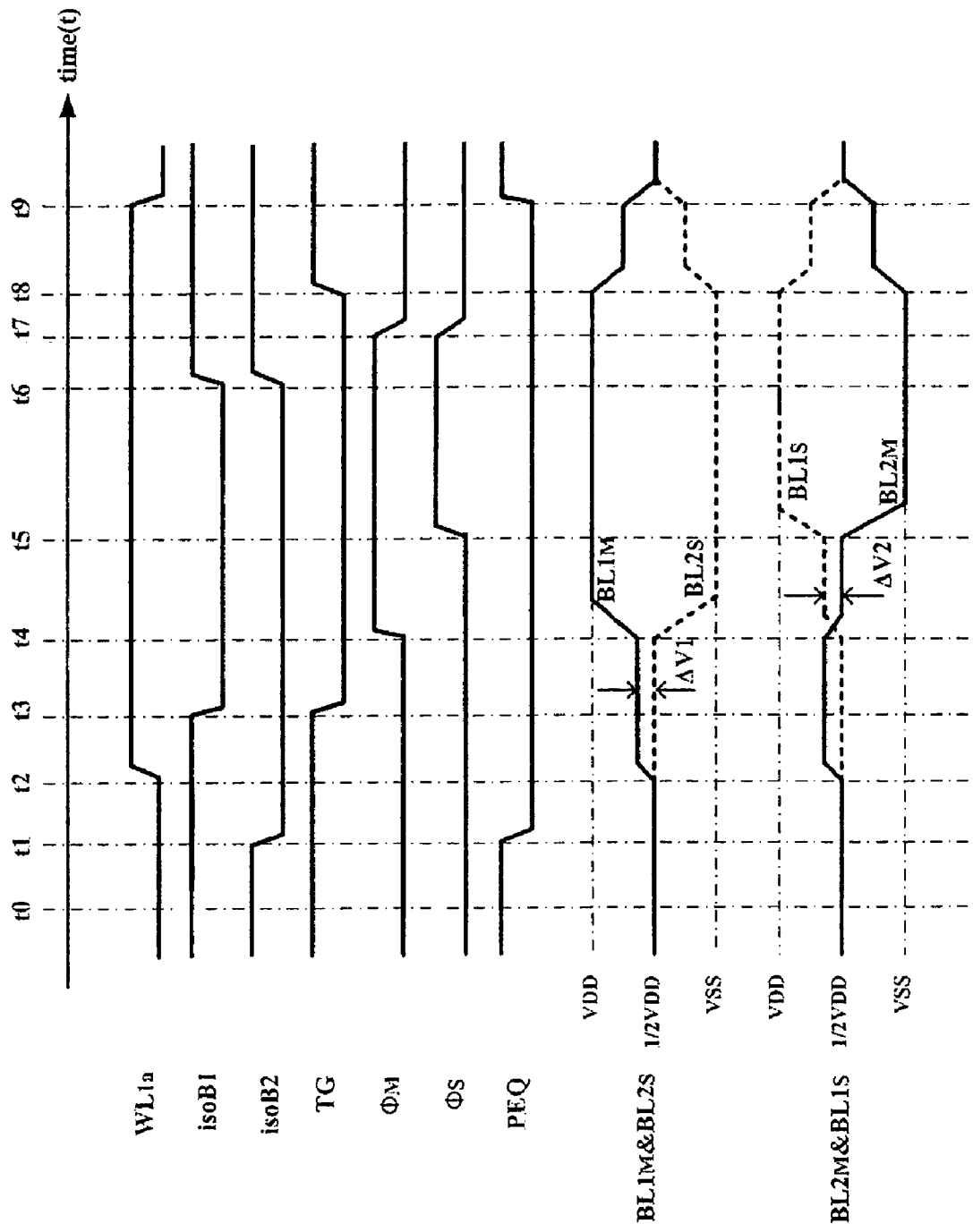
FIG. 2 is a timing diagram illustrating an operation of a multi-level dynamic memory device according to aspects of the present invention.

In FIG. 2, it is assumed that the memory cell 110 to be read is connected to a word line $WL_{1a}$ and the first main bit line $BL1_M$, as is shown in FIG. 1, and two bits of data (1, 0) are stored in the memory cell 110.

First, at time t0, the transfer signal TG and the first and second isolation signals isoB1 and isoB2 are at high levels, and accordingly, the first main bit line $BL1_M$ and the second main bit line $BL2_M$ are connected to each other and the first sub-bit line $BL1_S$ and the second sub-bit line $BL2_S$ are connected to each other. In addition, since the equalizing signal PEQ is at a high level, the first and second bit lines BL1 and BL2 are precharged to ½ VDD.

At time t1, since the second isolation signal isoB2 transitions to a low level, memory cells connected to the second main bit line $BL2_M$ are electrically isolated from the first and second $SA_M$ and $SA_S$.

At time t2, since the word line $WL_{1a}$ transitions to a high level, charges stored in the cell capacitor CS of the memory cell 110 are shared between the first and second main bit lines $BL1_M$ and $BL2_M$ through the first and second transfer transistors 121 and 122, which are turned on, which increases the voltages of the first and second $BL1_M$ and $BL2_M$ by $\Delta V1$.

At time t3, since the first isolation signal isoB1 transitions to a low level, memory cells connected to the first main bit line $BL1_M$ are electrically isolated from the first and second $SA_M$ and $SA_S$. In addition, since the transfer signal TG is at a low level, the first and second main bit lines $BL1_M$ and $BL2_M$ are electrically isolated from each other and the first and second sub-bit lines $BL1_S$ and $BL2_S$ are electrically isolated from each other.

At time t4, since the first sense amplifier enable signal $\Phi_M$ transitions to a high level, the voltage difference between the first main bit line $BL1_M$ and the second sub-bit line $BL2_S$ is amplified. That is, the voltage of the first main bit line $BL1_M$ increases to the voltage VDD and the second sub-bit line $BL2_S$ decreases to a voltage VSS.

On the other hand, since the first and second coupling capacitors $C_{C1}$ and $C_{C2}$ exist, when the voltage difference between the first main bit line $BL1_M$ and the second sub-bit line $BL2_S$ is amplified, the voltages of the second main bit line $BL2_M$ and the first sub-bit line $BL1_S$ vary in the directions opposite to each other. That is, when the voltage of the second main bit line $BL2_M$ decreases by $\Delta V2$, the voltage of the first sub-bit line $BL1_S$ increases by $\Delta V2$.

At time t5, since the second sense amplifier enable signal $\Phi_S$ transitions to a high level, the voltage difference between the second main bit line $BL2_M$ and the first sub-bit line $BL1_S$ is amplified. That is, the voltage of the second main bit line $BL2_M$ decreases to the voltage VSS and the voltage of the first sub-bit line $BL1_S$ increases to the voltage VDD.

At time t6 (before a restoring operation), since the first and second isolation signals isoB1 and isoB2 transitions to high levels, the plurality of memory cells are each electrically connected to the first and second sense amplifiers $SA_M$ and $SA_S$. As a result, the sensing results of the first and second sense amplifiers $SA_M$ and $SA_S$ are reflected on the first and second main bit lines $BL1_M$ and $BL2_M$, which are connected to the plurality of memory cells 110. At this time, since the transfer signal TG is at a low level, the first and second transfer transistors 121 and 122 are turned off and, accordingly, the first bit line BL1 and the second bit line BL2 are electrically isolated from each other.

At time t7, since the first sense amplifier enable signal $\Phi_M$ and the second sense amplifier enable signal $\Phi_S$ transitions to low levels, the first and second sense amplifiers $SA_M$ and $SA_S$ are disabled.

At time t8, when the transfer signal TG transitions to a high level, the first bit line BL1 and the second bit line BL2 are connected to each other. Specifically, through the first and second transfer transistors 121 and 122 which are turned on, the first and second main bit lines $BL1_M$ and $BL2_M$ are connected to each other, and become charge-shared. And the first and second sub-bit lines $BL1_S$ and $BL2_S$ are also connected to each other and become charge-shared. That is, a restoring operation in which bits are restored in the cell capacitor CS of the memory cell 110 is performed.

Specifically, a level of a voltage restored in the memory cell 110 connected to the first main bit line $BL1_M$ can be expressed by the following equation 1. In the equation, Vrst1 is a level of a voltage restored in the memory cell 110, $C_{total}$ is a total capacitance, $Q_{total}$ is a total amount of charge, $C_{BL1M}$ is a capacitance of the first main bit line $BL1_M$, $C_{BL2M}$ is a capacitance of the second main bit line $BL2_M$, and CS is a capacitance of the cell capacitor CS. Since the capacitance of the first main bit line $BL1_M$ is equal to the capacitance of the second main bit line $BL2_M$, the capacitance $C_{BL1M}$ is equal to the capacitance $C_{BL2M}$. Accordingly, in the case when the cell capacitor CS is implemented to have the same capacitance as that of each of the first and second main bit lines $BL1_M$ and $BL2_M$, $C_{BL1M}=C_{BL2M}=CS$. In recent years, the capacitance CS increases gradually as the technology of manufacturing a cell capacitor. Assuming this trend continues, it is expected that the capacitance CS will increase enough to approximate the bit line capacitance in the near future.

$$Vrst1 = \frac{Q_{total}}{C_{total}} = \frac{(C_{BL1M} + CS) \times VDD}{C_{BL1M} + CS + C_{BL2M}} = \frac{2CS \times VDD}{3CS} = \frac{2}{3}VDD \quad (1)$$

At time t9, in FIG. 2, since the word line $WL_{1a}$ transitions to a low level and the equalizing signal PEQ transitions to a high level, each of the first and second bit lines BL1 and BL2 is precharged to ½ VDD.

In the same manner as described above, even in cases of (0, 0), (0, 1), and (1, 1) are stored in memory cell 110, a read operation and a restoring operation can be precisely performed.

Figure 3:
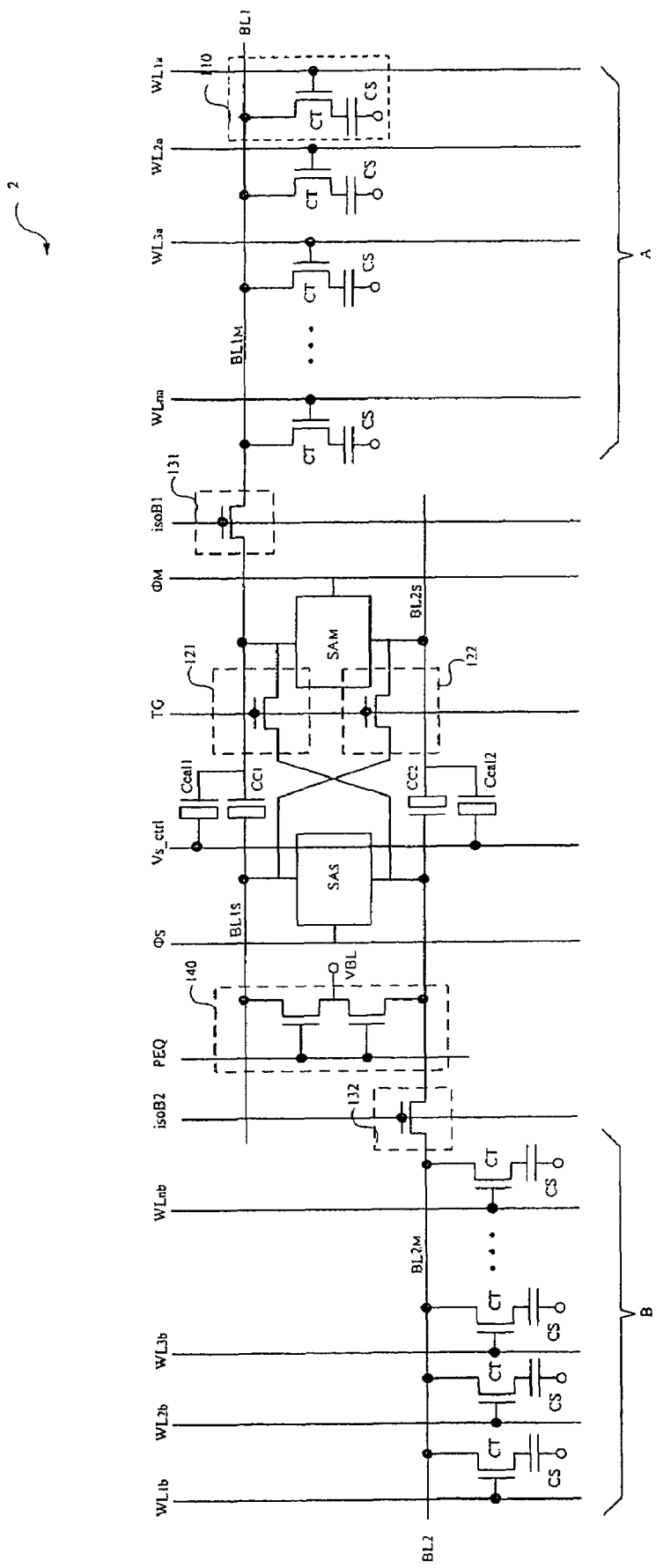
FIG. 3 is a circuit diagram illustrating another embodiment of a multi-level dynamic memory device according to another aspect of the present invention.

FIG. 3 is a circuit diagram illustrating another embodiment of a multi-level dynamic memory device 2. Here, the same components as in FIG. 1 are denoted by the same reference numerals, so a detailed explanation thereof will be omitted.

The multi-level dynamic memory device 2 further includes a first correction capacitor Ccal1 connected in parallel to the first coupling capacitor $C_{C1}$ and a second correction capacitor Ccal2 connected to the second coupling capacitor $C_{C2}$. The capacitances of the first and second correction capacitors Ccal1 and Ccal2 are adjusted by a first control voltage signal Vs_ctrl.

In this embodiment, the first correction capacitor Ccal1 is a MOS capacitor having a gate connected to a node of the first coupling capacitor $C_{C1}$ and a source and a drain connected to the first control voltage signal Vs_ctrl, and the second correction capacitor Ccal2 is a MOS capacitor having a gate connected to a node of the second coupling capacitor $C_{C2}$ and a source and a drain connected to the first control voltage signal Vs_ctrl.

In order to read bits stored in the memory cell 110 connected to the first main bit line $BL1_M$, when the first sense amplifier $SA_M$ amplifies the voltage difference between the first main bit line $BL1_M$ and the second sub-bit line $BL2_S$, the voltages of the second main bit line $BL2_M$ and the first sub-bit line $BL1_S$ vary in the directions opposite to each other (refer to time 't4' in FIG. 2). Such variation in the opposite directions depends on the capacitances of the first and second coupling capacitors $C_{C1}$ and $C_{C2}$, and the capacitances of the first and second coupling capacitors $C_{C1}$ and $C_{C2}$ tend not to be constant due to variations during a manufacturing process. However, since the multi-level dynamic memory device 2 includes the first and second correction capacitor Ccal1 and Ccal2, it is possible to maintain the value $\Delta V2$, which varies in the opposite directions, as a constant value even if the capacitances of the first and second coupling capacitors $C_{C1}$ and $C_{C2}$ vary.

Specifically, when the first control voltage signal Vs_ctrl is supplied as a low voltage, the effective capacitances of the first and second correction capacitors Ccal1 and Ccal2 increase. Accordingly, charges to be transferred from the first main bit line $BL1_M$ to the second main bit line $BL2_M$ through the first and second coupling capacitors $C_{C1}$ and $C_{C2}$ are largely dissipated. As a result, the value $\Delta V2$, which varies in the opposite directions, decreases.

Further, when the first control voltage signal Vs_ctrl is supplied as a high voltage, the effective capacitances of the first and second correction capacitors Ccal1 and Ccal2 decrease. Accordingly, the charges to be transferred from the first main bit line $BL1_M$ to the second main bit line $BL2_M$ through the first and second coupling capacitors $C_{C1}$ and $C_{C2}$ are less dissipated. As a result, the value $\Delta V2$ which varies in the opposite directions increases.

The voltage level of the first control voltage signal Vs_ctrl supplied to the first and second correction capacitors Ccal1 and Ccal2 can be adjusted in various ways. For example, the voltage level of the first control voltage signal Vs_ctrl can be adjusted by using a fuse trimming method in a wafer level or a package level. In addition, it is possible to adjust the voltage level of the first control voltage signal Vs_ctrl by using a mode resister set (MRS) signal when setting a multi-level dynamic memory device or by using a predetermined control signal varying according to an external temperature while the multi-level dynamic memory device operates.

Figure 4:
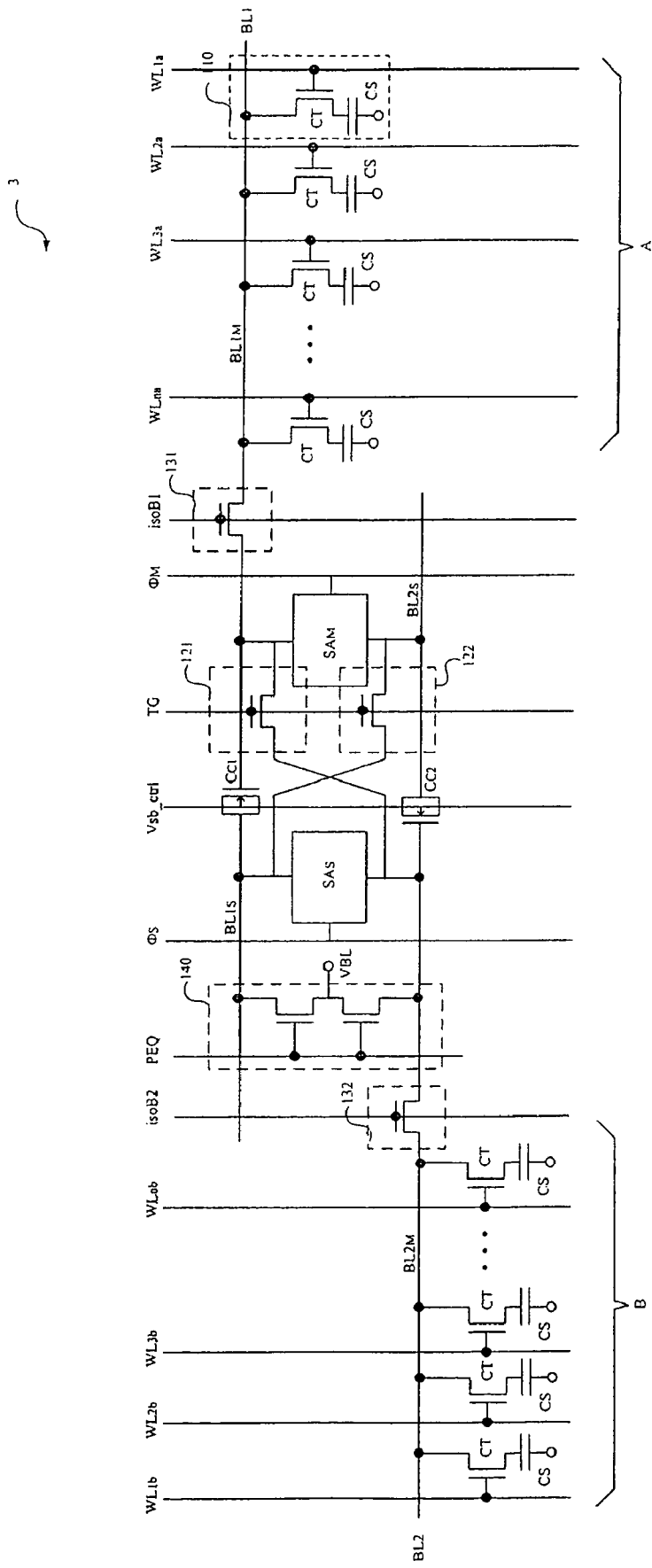
FIG. 4 is a circuit diagram illustrating still another embodiment of a multi-level dynamic memory device according to still another aspect of the present invention.

FIG. 4 is a circuit diagram illustrating still another embodiment of a multi-level dynamic memory device 3. Here, the same components as in FIGS. 1 and 3 are denoted by the same reference numerals, so a detailed explanation thereof will be omitted.

Referring to FIG. 4, the first and second correction capacitors (refer to Ccal1 and Ccal2 in FIG. 3) are not separately provided and the capacitances of the first and second coupling capacitors $C_{C1}$ and $C_{C2}$ are adjusted by a second control voltage signal Vsb_ctrl.

Specifically, in this embodiment, each of the first and second coupling capacitors $C_{C1}$ and $C_{C2}$ is a MOS capacitor, and the second control voltage signal Vsb_ctrl is connected to a substrate of the MOS capacitor. Referring to the following equation 2, it can be seen that a threshold voltage Vt of a MOSFET can be effectively changed due to a substrate voltage Vsb. Here, a voltage Vt0 is a threshold voltage when the substrate voltage Vsb is 0 V, $\psi_f$ is a physical parameter (typically, 2 $\psi_f$ is 0.6 V), and $\gamma$ is a process parameter. Since this means that the substrate serves as another gate, the variation of the threshold voltage Vt according to the substrate voltage Vsb is referred to as a "body effect."

$$Vt = Vt0 + \gamma(\sqrt{2\psi_f + Vsb} - \sqrt{2\psi_f}) \quad (2)$$

The voltage level of the second control voltage signal Vsb_ctrl can be adjusted in various ways. For example, the voltage level of the second control voltage signal Vsb_ctrl can be adjusted by using the fuse trimming method, a method using a mode resister set signal, or a method using a predetermined control signal.

According to the multi-level dynamic memory device having the open bit line structure as described above, since it is possible to reduce the size of a memory cell to less than 8 $F^2$/bit, the integration level can be increased.

While the foregoing has described what are considered to be the best mode and/or other preferred embodiments, it will be apparent to those skilled in the art that various modifications and changes can be made thereto without departing from the scope and spirit of the invention. Therefore, it should be understood that the above embodiments are not limitative, but illustrative in all aspects. It should also be understood that is intended by the following claims to claim that which is literally described and, all equivalents thereto, including all modifications and variations that fall within the scope of each claim.

What is claimed is:

1. A multi-level dynamic memory device comprising:
   a plurality of word lines;
   a plurality of bit lines provided in an open bit line structure;
   a plurality of memory cells, wherein each memory cell is connected to one of the word lines and one of the bit lines and configured to store at least two bits of data; and
   a plurality of sense amplifiers, each of which amplifies a voltage difference between the bit lines, the bit lines being located on opposite sides of each of the plurality of sense amplifiers.

2. The multi-level dynamic memory device of claim 1, wherein the size of each of the memory cells is smaller than 8 $F^2$/bit, where "F" denotes a minimum feature size.

3. A multi-level dynamic memory device comprising:
   a plurality of word lines;
   a first bit line and a second bit line provided in an open bit line structure, the first bit line being divided into a first main bit line and a first sub-bit line and the second bit line being divided into a second main bit line and a second sub-bit line;
   a plurality of memory cells, wherein each memory cell is connected to one of the word lines and one of the first or second main bit lines;
   a first sense amplifier connected between the first main bit line and the second sub-bit line and a second sense amplifier connected between the second main bit line and the first sub-bit line; and
   a first coupling capacitor connected between the first main bit line and the first sub-bit line and a second coupling capacitor connected between the second main bit line and the second sub-bit line.

4. The multi-level dynamic memory device of claim 3, wherein the size of each of the memory cells is smaller than 8 $F^2$/bit, where "F" denotes a minimum feature size.

5. The multi-level dynamic memory device of claim 3, wherein the capacitance of a cell capacitor of each of the memory cells is substantially equal to the capacitance of each of the first and second main bit lines.

6. The multi-level dynamic memory device of claim 3, further comprising:
   a first transfer transistor configured to selectively connect the first and second main bit lines to each other; and
   a second transfer transistor configured to selectively connect the first and second sub-bit lines to each other.

7. The multi-level dynamic memory device of claim 3, further comprising:
   a first isolation transistor located on the first bit line and configured to selectively isolate memory cells from the plurality of memory cells that are on the first bit line from the first sense amplifier; and
   a second isolation transistor located on the second bit line and configured to selectively isolate memory cells from the plurality of memory cells that are on the second bit line from the second sense amplifier.

8. The multi-level dynamic memory device of claim 3, further comprising:
   a first correction capacitor connected in parallel to the first coupling capacitor; and
   a second correction capacitor connected in parallel to the second coupling capacitor,
   wherein capacitances of the first and second correction capacitors are adjusted by a first control voltage signal.

9. The multi-level dynamic memory device of claim 8, wherein:
   the first correction capacitor is a MOS capacitor having a gate connected to a node of the first coupling capacitor and having a source and a drain supplied with the first control voltage signal; and
   the second correction capacitor is a MOS capacitor having a gate connected to a node of the second coupling capacitor and having a source and a drain supplied with the first control voltage signal.

10. The multi-level dynamic memory device of claim 3, wherein the capacitance of each of the first and second coupling capacitors is adjusted by a second control voltage signal.

11. The multi-level dynamic memory device of claim 10, wherein each of the first and second coupling capacitors is a MOS capacitor, and the second control voltage signal is supplied to a substrate of the MOS capacitor.

12. A multi-level dynamic memory device comprising:
   a plurality of word lines;
   a first bit line and a second bit line provided in an open bit line structure, the first bit line being divided into a first main bit line and a first sub-bit line and the second bit line being divided into a second main bit line and a second sub-bit line;
   a plurality of memory cells, wherein each memory cell is connected to one of the word lines and one of the first or second main bit lines;
   a first sense amplifier connected between the first main bit line and the second sub-bit line and a second sense amplifier connected between the second main bit line and the first sub-bit line;
   a first coupling capacitor connected between the first main bit line and the first sub-bit line and a second coupling capacitor connected between the second main bit line and the second sub-bit line;
   a first transfer transistor configured to selectively connect the first and second main bit lines to each other and a second transfer transistor configured to selectively connect the first and second sub-bit lines to each other; and a first isolation transistor located on the first bit line and configured to selectively isolate memory cells from the plurality of memory cells that are on the first bit line from the first sense amplifier; and a second isolation transistor located on the second bit line and configured to selectively isolate memory cells from the plurality of memory cells that are on the second bit line from the second sense amplifier.

13. A method of driving a multi-level dynamic memory device comprising:

providing the multi-level dynamic memory device comprising a plurality of word lines;

a first bit line and a second bit line provided in an open bit line structure, the first bit line being divided into a first main bit line and a first sub-bit line and the second bit line being divided into a second main bit line and a second sub-bit line;

a plurality of memory cells, wherein each memory cell is connected to one of the word lines and one of the first or second main bit lines;

a first sense amplifier connected between the first main bit line and the second sub-bit line and a second sense amplifier connected between the second main bit line and the first sub-bit line;

a first coupling capacitor connected between the first main bit line and the first sub-bit line and a second coupling capacitor connected between the second main bit line and the second sub-bit line;

a first transfer transistor configured to selectively connect the first and second main bit lines to each other and a second transfer transistor configured to selectively connect the first and second sub-bit lines to each other; and a first isolation transistor located on the first bit line and configured to selectively isolate memory cells from the plurality of memory cells that are on the first bit line from the first and second sense amplifiers; and a second isolation transistor located on the second bit line and configured to selectively isolate memory cells from the plurality of memory cells that are on the second bit line from the first and second sense amplifiers;

charge-sharing data of a memory cell, selected from the plurality of memory cells, that is connected to the first bit line, between the first and second main bit lines;

amplifying a voltage difference between the first main bit line and the second sub-bit line using the first sense amplifier;

amplifying a voltage difference between the second main bit line and the first sub-bit line using the second sense amplifier; and restoring data in the selected memory cell using the first and second main bit lines that are charge-shared.

14. The method of claim 13, wherein, in the charge-sharing and the restoring, the first and second transfer gates are turned on.

15. The method of claim 13, wherein, in the amplifying of the voltage difference using the first sense amplifier and in the amplifying of the voltage difference using the second sense amplifier, the first and second isolation transistors are turned off 16. The method of claim 15, wherein the method includes:

before the restoring of the data, turning on the first and second isolation transistors.

17. The method of claim 13, wherein the capacitance of a cell capacitor of each of the memory cells is substantially equal to the capacitance of each of the first and second main bit lines.

* * * * *